(12) United States Patent
Bai et al.

(10) Patent No.: US 9,461,078 B1
(45) Date of Patent: Oct. 4, 2016

(54) ARRAY SUBSTRATE, MANUFACTURING METHOD FOR THE SAME, DISPLAY DEVICE AND ELECTRONIC PRODUCT

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Yao Liu, Beijing (CN); Liangliang Li, Beijing (CN); Xiangqian Ding, Beijing (CN); Zongjie Guo, Beijing (CN)

(73) Assignees: BOE Technology Group Co., Ltd. (CN); Beijing BOE Display Technology Co., Ltd. (CN)

( * ) Notice: Subject to any disclaimer, the term of this patent is extended or adjusted under 35 U.S.C. 154(b) by 147 days.

(21) Appl. No.: 14/414,713

(22) PCT Filed: Apr. 8, 2014

(86) PCT No.: PCT/CN2014/074889
§ 371 (c)(1),
(2) Date: Jan. 14, 2015

(87) PCT Pub. No.: WO2015/100870
PCT Pub. Date: Jul. 9, 2015

(30) Foreign Application Priority Data

Dec. 31, 2013 (CN) .......................... 2013 1 0752680

(51) Int. Cl.
*H01L 23/48* (2006.01)
*H01L 27/12* (2006.01)
(Continued)

(52) U.S. Cl.
CPC ......... *H01L 27/1288* (2013.01); *G02F 1/1368* (2013.01); *G02F 1/133345* (2013.01);
(Continued)

(58) Field of Classification Search
CPC .......................... H01L 27/1288; H01L 27/124
USPC .......................................................... 257/749
See application file for complete search history.

(56) References Cited

U.S. PATENT DOCUMENTS 6,172,733 B1   1/2001  Hong et al.
2005/0106770 A1   5/2005  Song et al.

FOREIGN PATENT DOCUMENTS

CN   1577014 A   2/2005
CN   103107133 A   5/2013
(Continued)

OTHER PUBLICATIONS

Office Action in Chinese Patent Application No. 201310752680.8, dated Sep. 22, 2015.
(Continued)

*Primary Examiner* — Anthony Ho
(74) *Attorney, Agent, or Firm* — BakerHostetler LLP (57) ABSTRACT

According to the method for manufacturing an array substrate of the present disclosure, when two non-adjacent conductive layers are electrically connected to each other through the via-holes, the insulating layers between the adjacent conductive layers may be etched by several etching processes so as to form the corresponding via-holes in the insulating layer, thereby to achieve the electrical connection between the non-adjacent conductive layers. Meanwhile, it is also able to achieve the electrical connection between the adjacent conductive layers through the via-holes in each etching process. In other words, when at least three conductive layers are electrically connected with each other through the via-holes, merely the insulating layer between the adjacent conductive layers is etched in each etching process.

20 Claims, 2 Drawing Sheets (51) Int. Cl.
*H01L 21/768* (2006.01)
*H01L 21/027* (2006.01)
*H01L 21/311* (2006.01)
*G02F 1/1368* (2006.01)
*G02F 1/1343* (2006.01)
*G02F 1/1333* (2006.01)
*G02F 1/1362* (2006.01)

(52) U.S. Cl.
CPC ..... *G02F1/134363* (2013.01); *H01L 21/0274* (2013.01); *H01L 21/31144* (2013.01); *H01L 21/76802* (2013.01); *H01L 21/76877* (2013.01); *H01L 27/124* (2013.01); *G02F 2001/136236* (2013.01)

(56) References Cited

FOREIGN PATENT DOCUMENTS

| | | |
|---|---|---|
| CN | 103472645 A | 12/2013 |
| CN | 103472646 A | 12/2013 |
| CN | 103474399 A | 12/2013 |
| WO | 2012/056663 A1 | 5/2012 |

OTHER PUBLICATIONS

International Search Report and Written Opinion in PCT International Application No. PCT/CN2014/074889, dated Sep. 30, 2014.

Fig.1

-PRIOR ART-

# ARRAY SUBSTRATE, MANUFACTURING METHOD FOR THE SAME, DISPLAY DEVICE AND ELECTRONIC PRODUCT

CROSS-REFERENCE TO RELATED APPLICATION

This application is the U.S. national phase of PCT Application No. PCT/CN2014/074889 filed on Apr. 8, 2014, which claims priority to Chinese Patent Application No. 201310752680.8 filed on Dec. 31, 2013, the disclosures of which are incorporated in their entirety by reference herein.

FIELD OF THE INVENTION

The present disclosure relates to the field of display technology, in particular to an array substrate, its manufacturing method, a display device and an electronic product.

DESCRIPTION OF THE PRIOR ART

Thin film transistor liquid crystal display (TFT-LCD) is an important flat panel display device, and via-hole design is a very important part for the manufacture of an array substrate of a TFT-LCD panel. Usually, it is required to connect metals at different layers through via-holes at a peripheral circuit region of the array substrate. A via-hole formation process will directly affect the product yield as well as the relevant performances of the display panel.

Figure 1:
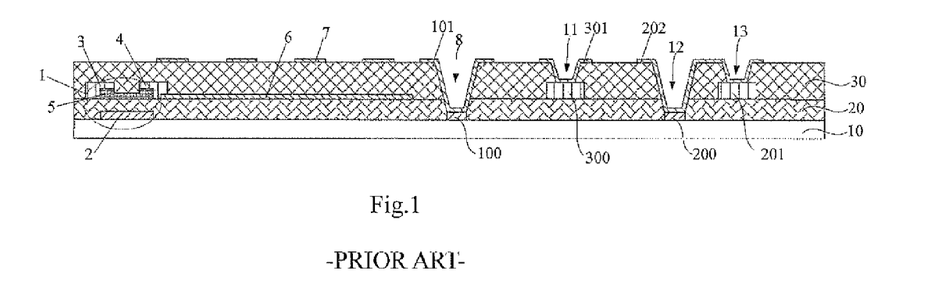
FIG. 1 is a schematic view showing an existing TFT array substrate with an ADS mode.

As shown in FIG. 1, in a process for manufacturing an existing TFT array substrate having an ADS display mode, the via-holes for connecting the metals at different layers are formed by the following steps:

forming a gate metal layer, performing a patterning process on the gate metal layer so as to form a gate electrode 2, a first pattern 100 connected to a second transparent conductive metal layer, and a second pattern 200 connected to a source/drain metal layer;

forming a gate insulating layer thin film 20;

forming a first transparent conductive metal layer thin film, and performing a patterning process on the first transparent conductive metal layer thin film so as to form a pixel electrode 6;

forming an active layer thin film, and performing a patterning process on the active layer thin film so as to form an active layer pattern 5 of a thin film transistor (TFT) 1;

forming a source/drain metal layer thin film, and performing a patterning process on the source/drain metal layer so as to form a source electrode 3 and a drain electrode 4 of the TFT 1, a third pattern 300 connected to the second transparent conductive metal layer, and a fourth pattern 201 connected to the gate metal layer, the drain electrode 4 being lapped onto the pixel electrode 6 so as to form an electrical connection;

forming a passivation layer 30, and performing a patterning process on the passivation layer thin film 30 so as to form a first via-hole 8 extending to the gate metal layer, a second via-hole 11 extending to the source/drain metal layer, a third via-hole 12 extending to the gate metal layer, and a fourth via-hole 13 extending to the source/drain metal layer; and forming the second transparent conductive metal layer thin film, and performing a patterning process on the second transparent conductive metal layer thin film so as to form a slit common electrode 7, a fifth pattern 101 connected to the gate metal layer through the first via-hole 8, a sixth pattern 301 connected to the source/drain metal layer through the second via-hole 11, and a seventh pattern 202 connected to the second pattern 200 and the fourth pattern 201 through the third via-hole 12 and the fourth via-hole 13, respectively.

However, there exist the following defects during the formation of the via-holes. At first, the via-hole, either deep or shallow, is formed by a single exposing and etching process, which will easily result in such a phenomenon as metal over-etching at a shallow-hole region, as well as an abnormal angle of gradient for the via-hole. For example, when forming the first via-hole 8 and the third via-hole 12, it is required to etch the passivation layer 30 and the gate insulating layer 20, but when forming the second via-hole 11 and the fourth via-hole 13, it is merely required to etch the passivation layer 30. Hence, when the second via-hole 11 and the fourth via-hole 13 are formed so as to expose the source/drain metal layer, only the passivation layer 30 is etched through the first via-hole 8 and the third via-hole 12, and when the gate insulating layer 20 is etched, over-etching will occur for the exposed source/drain metal layer at regions where the second via-hole 11 and the fourth via-hole 13 are located.

Next, a transparent conductive metal wire is used to connect the via-holes, and a via-hole connection resistance is too high due to a relatively high resistance of the transparent conductive metal wire. As a result, an uneven resistance within the substrate will be obtained, and such defects as greenish and H-blocks will occur. For example, when the second pattern 200 of the gate metal layer is connected to the fourth pattern 201 of the source/drain metal layer through the seventh pattern 202 of the second transparent conductive metal layer, the connection resistance will be too high.

SUMMARY OF THE INVENTION

Problems to be Solved

An object of the present disclosure is to provide an array substrate, its manufacturing method, a display device and an electronic device, so as to prevent the occurrence of over-etching and abnormal angle of gradient for a shallow via-hole when both deep and shallow via-holes are formed simultaneously by a single etching process to connect at least three conductive layers, thereby to improve the display quality of the display device and the electronic product.

Technical Solutions

In one aspect, the present disclosure provides a method for manufacturing a thin film transistor (TFT) array substrate, including:

forming a first metal layer on a base substrate, and performing a patterning process on the first metal layer so as to form a pattern including a first connection pattern;

forming a first insulating layer on the first metal layer, and performing a patterning process on the first insulating layer so as to form one or more first via-holes corresponding to a position where the first connection pattern is located;

forming a second metal layer on the first insulating layer, and performing a patterning process on the second metal layer so as to form a pattern including a second connection pattern;

forming a second insulating layer on the second metal layer, and performing a patterning process on the second insulating layer so as to form one or more transition via-holes corresponding to positions where the first via-holes are located and one or more second via-holes corresponding to a position where the second connection pattern is located; and forming a pattern including a first conductive layer on the second insulating layer.

In another aspect, the present disclosure provides a TFT array substrate, including:

a first metal layer, a first insulating layer, a second metal layer, a second insulating layer and a first conductive layer sequentially formed on a base substrate, wherein the first metal layer includes a first connection pattern, the first insulating layer includes a first via-hole, the second metal layer includes a second connection pattern, the second insulating layer includes a transition via-hole and a second via-hole, the first via-hole corresponds to a position where the first connection pattern is located, the transition via-hole corresponds to a position where the first via-hole is located, the first metal layer is electrically connected to the first conductive layer through the first via-hole and the transition via-hole, the second via-hole corresponds to a position where the second connection pattern is located, and the second metal layer is electrically connected to the first conductive layer through the second via-hole.

In yet another aspect, the present disclosure provides a display device including at least the above-mentioned TFT array substrate.

In still yet another aspect, the present disclosure provides an electronic product including at least the above-mentioned display device.

Advantageous Effects

The present disclosure has the following advantageous effects. According to the present disclosure, when two non-adjacent conductive layers are electrically connected to each other through the via-holes, the insulating layers between the adjacent conductive layers may be etched by several etching processes so as to form the corresponding via-holes in the insulating layer, thereby to achieve the electrical connection between the non-adjacent conductive layers. Meanwhile, it is also able to achieve the electrical connection between the adjacent conductive layers through the via-holes in each etching process. In other words, when at least three conductive layers are electrically connected with each other through the via-holes, merely the insulating layer between the adjacent conductive layers is etched in each etching process, and there is no difference in terms of the deep via-hole and the shallow via-hole. As a result, it is able to prevent the occurrence of over-etching for the shallow via-hole as well as an abnormal angle of gradient, thereby to improve the yield and quality of the product. Further, the patterns of the conductive layers above the insulating layers are formed simultaneously by performing a patterning process on the insulating layers, and the photoresist at a region where no pattern is formed is reserved. After the conductive layers are formed, the patterns of the conductive layers will be formed by removing the photoresist. Although having an additional patterning process for the insulating layer, the patterning process for the conductive layer thereon is omitted, so the production cost thereof will not increase.

BRIEF DESCRIPTION OF THE DRAWINGS

In order to illustrate the technical solutions of the present disclosure or the prior art in a clearer manner, the drawings desired to be sued in the embodiments will be briefly described hereinafter. Obviously, the following drawings merely relate to some embodiments of the present disclosure, and based on these drawings, a person skilled in the art, without any creative effort, may obtain the other drawings.

DETAILED DESCRIPTION OF THE PREFERRED EMBODIMENTS

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, the technical or scientific terms used herein shall have the common meanings understandable for a person of ordinary skills in the art. Such words as "first" and "second" in the specification and the appended claims are merely used to differentiate different components from each other, rather than to show any order, number or significance. Similarly, such expressions as "a" "an" or "one" are merely used to indicate that there is at least one part/component, rather than to define the number thereof. Such words as "connecting" and "connected" may include, apart from physical or mechanical connection, electrical connection too, whether direct or indirect. Such words as "up", "down", "left" and "right" are merely used to indicate the relative position relationship, and when an absolute position of an object is changed, the relative position relationship will be changed correspondingly.

The principles and features of the present disclosure will be described hereinafter in conjunction with the drawings, and the following embodiments are for illustrative purposes only, but shall not be used to limit the scope of the present disclosure.

In order to make the objects, the technical solutions and the advantages of the present disclosure more apparent, the present disclosure will be described hereinafter in conjunction with the drawings and embodiments.

First Embodiment

In this embodiment, a method for manufacturing a TFT array substrate, particularly a method for forming a via-hole in an insulating layer for electrically connecting different conductive layers of the array substrate, is provided. In the prior art, the via-hole in the insulating layer is formed by a single etching process so as to connect the different conductive layers. When three or more conductive layers are desired to be connected, there will exist both deep via-holes and shallow via-holes in the insulating layers for electrically connecting different conductive layers. However, due to the formation of the deep via-hole (which is used to connect two non-adjacent conductive layers, so it is required to etch the insulating layers between three or more conductive layers) and the shallow via-hole (which is used to connect two adjacent conductive layers, so it is merely required to etch the insulating layer between two conductive layers) by a single etching process, such defects as over-etching for the shallow via-holes and an abnormal angle of gradient will occur.

In order to solve the above defects, the method for manufacturing the TFT array substrate in this embodiment includes:

forming a first metal layer on a base substrate, and performing a patterning process on the first metal layer so as to form a pattern including a first connection pattern;

forming a first insulating layer on the first metal layer, and performing a patterning process on the first insulating layer so as to form one or more first via-holes corresponding to a position where the first connection pattern is located;

forming a second metal layer on the first insulating layer, and performing a patterning process on the second metal layer so as to form a pattern including a second connection pattern;

forming a second insulating layer on the second metal layer, and performing a patterning process on the second insulating layer to form one or more transition via-holes corresponding to positions where the first via-holes are located and one or more second via-holes corresponding to a position where the second connection pattern is located; and forming a pattern including a first conductive layer on the second insulating layer.

According to the above method, when it is desired to electrically connect the first metal layer and first conductive layer that are non-adjacent, the first via-hole(s) is(are) formed in the first insulating layer above the first conductive layer by a first etching process, so as to expose the connection pattern of the first metal layer. Then, the connection pattern of the second metal layer is formed on the first insulating layer, and the transition via-hole(s) and the second via-hole(s) are formed in the second insulating layer above the second metal layer by a second etching process, so as to expose the connection pattern of the first metal layer and the connection pattern of the second metal layer. When the first conductive layer is formed on the second insulating layer, it is connected to the connection pattern of the first metal layer through the transition via-hole(s), so as to electrically connect the first metal layer and first conductive layer that are non-adjacent. In addition, the first conductive layer is connected to the connection pattern of the second metal layer through the second via-hole(s), so as to electrically connect the second metal layer and the first conductive layer adjacent to each other. Moreover, the electrical connection between the first metal layer and the second metal adjacent to each other may also be achieved by the first etching process. Due to the identical etching depth for each etching process, there will exist no difference in terms of the deep via-hole and the shallow via-hole. And as a result, it is able to prevent such defects as over-etching for the shallow via-hole and an abnormal angle of gradient, thereby to improve the yield and quality of the product.

It is to be noted that, the expressions "adjacent conductive layers" and "non-adjacent conductive layers" mentioned in this embodiment merely refer to the conductive layers, exclusive of the insulating layer therebetween. In other words, if there is only an insulating layer between two conductive layers, these conductive layers are considered to be adjacent to each other, and if there is another conductive layer between the two conductive layers, these conductive layers are considered to be not adjacent to each other.

To be specific, for the TFT array substrate, the first metal layer is a gate metal layer which is further used to form a gate electrode. The second metal layer is a source/drain metal layer which is further used to form a source electrode and a drain electrode. The first conductive layer is a first transparent conductive layer (e.g., ITO or IZO), and correspondingly the first insulating layer is a gate insulating layer. According to the present disclosure, it is able to achieve the electrical connection between any two of, or among, the gate metal layer, the source/drain metal layer and the transparent conductive layer on the TFT array substrate.

Further, the patterning process is performed on the source/drain metal layer (i.e., the second metal layer) so as to further form a first electrical connection pattern. And the gate metal layer (i.e., the first metal layer) is electrically connected to the first transparent conductive layer (i.e., the first conductive layer) through the first via-hole(s), the first electrical connection pattern and the transition via-hole(s). Because the first electrical connection pattern connecting the gate metal layer and the transparent conductive layer is just the source/drain metal layer, it is able to reduce the resistance of the via-hole connection metal and improve the display quality of the array substrate, thereby to significantly improve the yield of the entire array substrate and the performance of a resultant display panel.

ADSDS (ADvanced Super Dimension Switch, ADS for short) is a wide viewing angle core technique for a planar electrical field system, and its features may be described as forming a multi-dimensional electric field by means of electrical fields generated at edges of slit electrodes within an identical plane and an electrical field generated between a slit electrode layer and a plate electrode layer, so as to enable all the liquid crystal molecules between the slit electrodes and right above the electrodes within a liquid crystal cell to rotate, thereby to improve the operational efficiency of the liquid crystal molecules and enhance the light transmission efficiency. ADS may be used to improve the image quality of a TFT-LCD product, and has such advantages as high resolution, high transmittance, low power consumption, wide viewing angle, high aperture ratio, low chromatic aberration, free of push Mura and so forth. For different applications, the improved techniques of ADS may include I-ADS (for high transmittance), H-ADS (for high aperture ratio) and S-ADS (for high resolution).

For the TFT array substrate with an ADS mode, a pixel electrode and a common electrode of the display panel are both formed on the array substrate. Due to an additional patterning process for the gate insulating layer, the production cost thereof will certainly increase. In this embodiment, in order to prevent an increase in terms of the production cost, the pixel electrode is formed on the first insulating layer. The pixel electrode is formed by the second conductive layer which is a second transparent conductive layer with high transmittance, and a pattern of the first insulating layer and a pattern of the second transparent conductive layer are formed simultaneously by a single patterning process.

To be specific, the step of forming the pattern of the first insulating layer and the pattern of the second transparent conductive layer by a single patterning process includes:

applying a first photoresist onto the first insulating layer (i.e., the gate insulating layer), and exposing and developing the first photoresist by using a half-tone or gray-tone mask, so as to form a first photoresist partially-reserved region corresponding to at least a region where the pixel electrode is located, a first photoresist unreserved region corresponding to at least a region where the first via-hole(s) is(are) located, and a first photoresist fully-reserved region corresponding to the other regions;

removing the first insulating layer at the first photoresist unreserved region by an etching process, so as to form the first via-hole(s) corresponding to a position where the first connection pattern of the gate metal layer is located;

removing the photoresist at the first photoresist partially-reserved region by an ashing process, so as to form a pattern of the pixel electrode; and forming the second transparent conductive layer on the first photoresist and removing the remained photoresist, so as to form the pixel electrode.

Through the above steps, the pattern of the gate insulating layer and the pixel electrode may be formed by merely one etching process, and a patterning process for forming the pixel electrode may be omitted, so the production cost will not increase. In addition, the pixel electrode is located below the source electrode and the drain electrode, and electrically connected to the drain electrode in a lapping manner. Correspondingly, the first transparent conductive layer (i.e., the first conductive layer) is used to form the slit common electrode.

Further, in order to reduce the production cost, a pattern of the second insulating layer and a pattern of the slit common electrode may also be formed simultaneously by the above process, which includes the steps of:

applying a second photoresist onto the second insulating layer, and exposing and developing the second photoresist by using a half-tone or gray-tone mask, so as to form a second photoresist partially-reserved region corresponding to at least a region where the slit common electrode is located, a second photoresist unreserved region corresponding to at least regions where the transition via-hole(s) and the second via-hole(s) are located, and a second photoresist fully-reserved region corresponding to the other regions;

removing the second insulating layer at the second photoresist unreserved region by an etching process, so as to form the transition via-hole(s) and the second via-hole(s);

removing the photoresist at the second photoresist partially-reserved region by an ashing process, so as to form the pattern of the slit common electrode; and forming the first transparent conductive layer on the second photoresist and removing the remained photoresist, so as to form the slit common electrode.

Through the above steps, the pattern of the second insulating layer and the slit common electrode may be formed by merely one etching process, and a patterning process forming the slit common electrode is omitted. As a result, it is able to reduce the production cost.

As shown in FIGS. 2-5, in a preferred embodiment, the method for manufacturing the TFT array substrate with an ADS mode includes the following steps.

Figure 2:
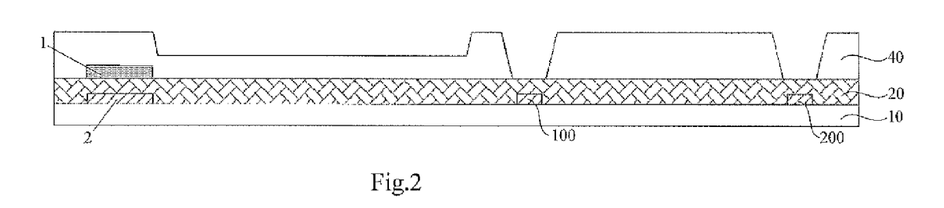
FIGS. 2-8 are schematic views showing the procedures of manufacturing a TFT array substrate with an ADS mode according to embodiments of the present disclosure.

Step a: forming the gate metal layer on the base substrate 10, and forming the pattern of the gate metal layer by a first patterning process. To be specific, at first, a photoresist is applied onto the gate metal layer, and then exposed and developed by using a common mask so as to form a photoresist reserved region corresponding to at least the regions where the gate electrode 2, the first connection pattern 100 and a third connection pattern 200 are located, and a photoresist unreserved region corresponding to the other regions. Then, the gate metal layer at the photoresist unreserved region is removed by an etching process, and the remaining photoresist is removed too, so as to form the gate electrode 2, the first connection pattern 100 and the third connection pattern 200, as shown in FIG. 2. The first connection pattern 100 is electrically connected to the first transparent conductive layer, and the third connection pattern 200 is electrically connected to the source/drain metal layer.

Figure 3:
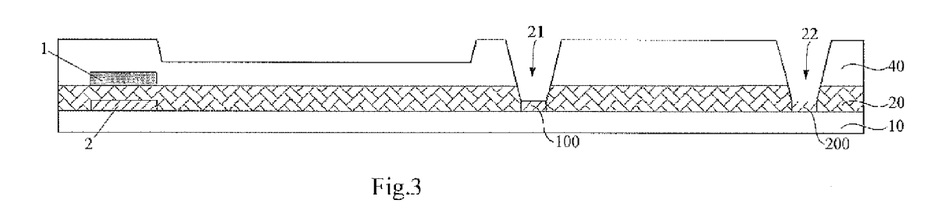
Figure 4:
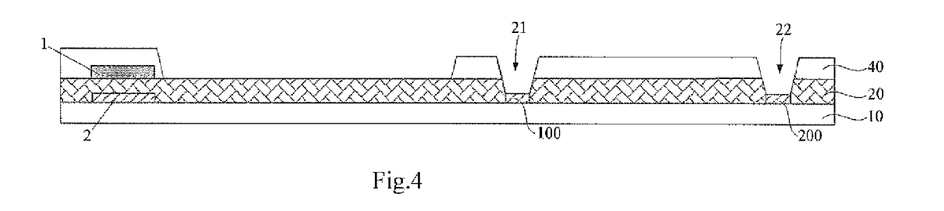

Step b: forming the gate insulating layer 20 on the gate metal layer, and forming the pattern of the gate insulating layer by a second patterning process. To be specific, at first the first photoresist 40 is applied onto the gate insulating layer 20, and then exposed and developed by using a half-tone or gray-tone mask, so as to form the first photoresist partially-reserved region corresponding to at least the region where the pixel electrode is located, the first photoresist unreserved region corresponding to at least the region where the first via-hole(s) is(are) located, and the first photoresist fully-reserved region corresponding to the other regions, as shown in FIG. 2. Then, the gate insulating layer 20 at the first photoresist unreserved region is removed by an etching process, so as to form the first via-holes 21, 22, and expose the first connection pattern 100 and the third connection pattern 200, as shown in FIG. 3. Finally, the photoresist at the first photoresist partially-reserved region is removed by an ashing process, so as to form the pattern of the pixel electrode, as shown in FIG. 4.

Step c: forming the second transparent conductive layer on the first photoresist and removing the remained photoresist, so as to form the pixel electrode 6. The second transparent conductive layer is further formed at the first via-hole 21 corresponding to the first connection pattern 100, as shown in FIG. 5.

Figure 5:
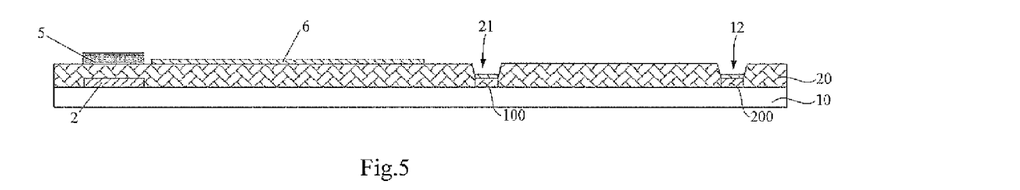

Step d: forming an active layer on the pixel electrode 6 and forming an active layer pattern 5 of the TFT by a third patterning process, as shown in FIG. 5.

Figure 6:
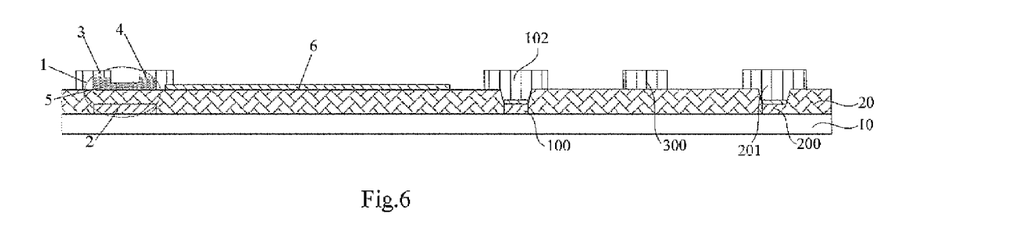

Step e: forming the source/drain metal layer on the active layer, and forming a pattern of the source/drain metal layer by a fourth patterning process. To be specific, at first the a photoresist is applied onto the source/drain metal layer, and then exposed and developed by using a common mask, so as to form a photoresist unreserved region corresponding to at least regions where the source electrode 3, the drain electrode 4, the first electrical connection pattern 102, the second connection pattern 300 and the fourth connection pattern 201 are located, and a photoresist reserved region corresponding to the other regions. Then, the source/drain metal layer at the photoresist reserved region is removed by an etching process, so as to form the source electrode 3, the drain electrode 4, the first electrical connection pattern 102, the second connection pattern 300 and the fourth connection pattern 201. The fourth connection pattern 201 is connected to the third connection pattern 300 through the first via-hole(s) 12, so as to electrically connect the gate metal layer and the source/drain metal layer, as shown in FIGS. 5 and 6.

Figure 7:
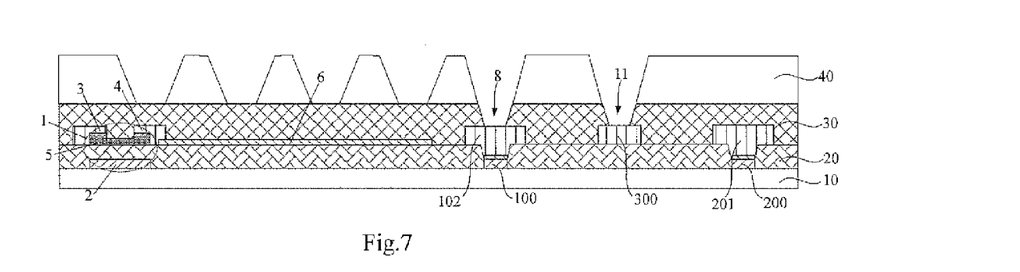

Step f: forming the second insulating layer 30 on the source/drain metal layer, and forming the pattern of the second insulating layer and the pattern of the second transparent conductive layer by a fifth patterning process. To be specific, at first the second photoresist 40 is applied onto the second insulating layer 30, and then exposed and developed by using a half-tone or gray-tone mask, so as to form the second photoresist unreserved region corresponding to at least the regions where the transition via-hole(s) and the second via-hole(s) are located, the second photoresist partially-reserved region corresponding to the region where the slit common electrode is located, and the second photoresist fully-reserved region corresponding to the other regions. Then, the second insulating layer at the second photoresist unreserved region is removed by an etching process, so as to form the transition via-hole(s) 8 and the second via-hole(s) 11, and expose the first electrical connection pattern 102 and the second connection pattern 300, respectively. Next, the photoresist at the second photoresist partially-reserved region is removed by an ashing process, so as to form the pattern of the slit common electrode, as shown in FIG. 7.

Step g: forming the first transparent conductive layer on the second photoresist and removing the remained photoresist, so as to form the slit common electrode 7, a fifth connection pattern 101 and a sixth connection pattern 301. The fifth connection pattern 101 is connected to the first connection pattern 100 through the second via-hole(s) 11 and the first electrical connection pattern 102, so as to connect the transparent conductive layer and the gate metal layer. The sixth connection pattern 301 is connected to the second connection pattern 300 through the second via-hole(s) 11, so as to connect the transparent conductive layer and the source/drain metal layer.

In a word, according to the above Steps a-g, the display device with an ADS mode may be manufactured through five patterning processes. In addition, it is able to achieve the electrical connection between any two of the transparent conductive layer, the source/drain metal layer and the gate metal layer, and prevent the occurrence of over-etching for the shallow via-hole as well as an abnormal angle of gradient. Because the gate metal layer, the source/drain metal layer and the transparent conductive layer are electrically connected to each other through the source/drain metal layer, other than the transparent conductive layer in the prior art, it is able to reduce the resistance of via-hole connection metal and improve the display quality of the display panel, thereby to significantly improve the yield and the performance of the display panel.

It should be appreciated that, the present disclosure may also be used to electrically connect any two of four or more conductive layers, so as to prevent the occurrence of over-etching for the shallow via-hole as well as an abnormal angle of gradient. The implementation method is substantially identical to that mentioned above, and it will not be repeated herein.

According to the method of the present disclosure, when two non-adjacent conductive layers are electrically connected to each other through the via-holes, the insulating layers between the adjacent conductive layers may be etched by several etching processes so as to form the corresponding via-holes in the insulating layer, thereby to achieve the electrical connection between the non-adjacent conductive layers. Meanwhile, it is also able to achieve the electrical connection between the adjacent conductive layers through the via-holes in each etching process. In other words, when at least three conductive layers are electrically connected with each other through the via-holes, merely the insulating layer between the adjacent conductive layers is etched in each etching process, and there is no difference in terms of the deep via-hole and the shallow via-hole. As a result, it is able to prevent the occurrence of over-etching for the shallow via-hole as well as an abnormal angle of gradient, thereby to improve the yield and quality of the product. Further, the patterns of the conductive layers above the insulating layers are formed simultaneously by performing a patterning process on the insulating layers, and the photoresist at a region where no pattern is formed is reserved. After the conductive layers are formed, the patterns of the conductive layers will be formed by removing the photoresist. Although with an additional patterning process for the insulating layer, the patterning process for the conductive layer thereon is omitted, so the production cost thereof will not increase.

Second Embodiment

Based on an identical inventive concept, the present disclosure provides in this embodiment an array substrate which includes a first metal layer, a first insulating layer, a second metal layer, a second insulating layer and a first conductive layer sequentially formed on a base substrate, wherein the first metal layer includes a first connection pattern, the first insulating layer includes a first via-hole, the second metal layer includes a second connection pattern, the second insulating layer includes a transition via-hole and a second via-hole, the first via-hole corresponds to a position where the first connection pattern is located, the transition via-hole corresponds to a position where the first via-hole is located, the first metal layer is electrically connected to the first conductive layer through the first via-hole and the transition via-hole, the second via-hole corresponds to a position where the second connection pattern is located, and the second metal layer is electrically connected to the first conductive layer through the second via-hole.

According to the above array substrate, when it is desired to electrically connect the first metal layer and first conductive layer that are non-adjacent, the first via-hole is formed in the first insulating layer above the first conductive layer by a first etching process, so as to expose the connection pattern of the first metal layer. Then, the connection pattern of the second metal layer is formed on the first insulating layer, and the transition via-hole and the second via-hole are formed in the second insulating layer above the second metal layer by a second etching process, so as to expose the connection pattern of the first metal layer and the connection pattern of the second metal layer. When the first conductive layer is formed on the second insulating layer, it is connected to the connection pattern of the first metal layer through the transition via-hole, so as to electrically connect the first metal layer and first conductive layer that are non-adjacent. In addition, the first conductive layer is connected to the connection pattern of the second metal layer through the second via-hole, so as to electrically connect the second metal layer and the first conductive layer adjacent to each other. Moreover, the electrical connection between the first metal layer and the second metal adjacent to each other may also be achieved by the first etching process. Due to the identical etching depth for each etching process, there will exist no difference in terms of the deep via-hole and the shallow via-hole, and as a result, it is able to prevent such defects as over-etching for the shallow via-hole and an abnormal angle of gradient, thereby to improve the yield and quality of the product.

To be specific, for the TFT array substrate, the first metal layer is a gate metal layer which is further used to form a gate electrode, the second metal layer is a source/drain metal layer which is further used to form a source electrode and a drain electrode, the first conductive layer is a first transparent conductive layer (e.g., ITO or IZO), and correspondingly the first insulating layer is a gate insulating layer. According to the present disclosure, it is able to achieve the electrical connection between any two of or among, the gate metal layer, the source/drain metal layer and the transparent conductive layer on the TFT array substrate.

Further, a first electrical connection pattern is provided between the first via-hole and the transition via-hole and made of a material identical to the source/drain metal layer (i.e., the second metal layer), so the gate metal layer (i.e., the first metal layer) is electrically connected to the first transparent conductive layer (i.e., the first conductive layer) through the first via-hole, the first electrical connection pattern and the transition via-hole. Because the first electrical connection pattern connecting the gate metal layer and the first transparent conductive layer is just the source/drain metal layer, it is able to reduce the resistance of the via-hole connection metal and improve the display quality of the array substrate, thereby to significantly improve the yield of the entire array substrate and the performance of a resultant display panel.

For the TFT array substrate with an ADS mode, it includes a pixel electrode and a common electrode. Due to an additional patterning process for the gate insulating layer, the production cost thereof will certainly increase. In this embodiment, in order to prevent an increase in the production cost, the patterns of the pixel electrode and the gate insulating layer are formed by a single patterning process in this embodiment. To be specific, the pixel electrode is formed by the second conductive layer which is a second transparent conductive layer having high transmittance. The second transparent conductive layer is further formed at the first via-hole 21 corresponding to the first connection pattern.

The step of forming the patterns of the pixel electrode and the gate insulating layer by a single patterning process includes the steps of:

applying a first photoresist onto the gate insulating layer, and exposing and developing the first photoresist by using a half-tone or gray-tone mask, so as to form a first photoresist partially-reserved region corresponding to at least a region where the pixel electrode is located, a first photoresist unreserved region corresponding to at least a region where the first via-hole is located, and a first photoresist fully-reserved region corresponding to the other regions;

removing the first insulating layer at the first photoresist unreserved region by an etching process, so as to form the first via-hole;

removing the photoresist at the first photoresist partially-reserved region by an ashing process, so as to form a pattern of the pixel electrode; and forming the second transparent conductive layer on the first photoresist and removing the remained photoresist, so as to form the pixel electrode, the second transparent conductive layer being arranged below the source/drain metal layer.

The drain electrode formed by the above steps is arranged above the pixel electrode, and electrically connected to the pixel electrode in a lapping manner. The first transparent conductive layer further includes a slit common electrode arranged above the pixel electrode.

Figure 8:
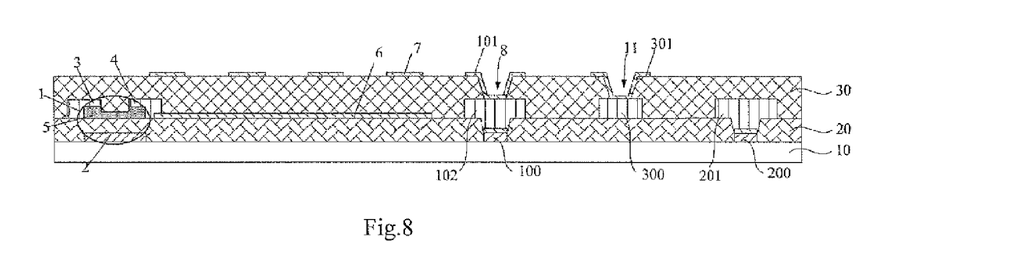

As shown in FIG. 8, the TFT array substrate with an ADS mode in this embodiment includes:

the base substrate 10;

the patterned gate metal layer formed on the base substrate 10 and including the gate electrode 2, the first connection pattern 100 and the third connection pattern 200, the first connection pattern 100 being electrically connected to the first transparent conductive layer, and the third connection pattern 200 being electrically connected to the source/drain metal layer;

an active layer pattern 5 formed on the gate metal layer and corresponding to a position where the gate electrode 2 is located;

the patterned gate insulating layer and the patterned second transparent conductive layer formed sequentially on the gate metal layer by a single patterning process, the gate insulating layer including one or more first via-holes so as to expose the first connection pattern 100 and the third connection pattern 200, the second transparent conductive layer including the pixel electrode 6 and a pattern formed at the first via-hole corresponding to the first connection pattern;

the patterned source/drain metal layer formed on the second transparent conductive layer and including the source electrode 3, the drain electrode 4, the first electrical connection pattern 102, the second connection pattern 300 and the fourth connection pattern 201, the drain electrode 4 being electrically connected to the pixel electrode 6 in a lapping manner, the first electrical connection pattern 102 being electrically connected to the first connection pattern 100 through the first via-hole, and the fourth connection pattern 201 being electrically connected to the third connection pattern 200 through the first via-hole, so as to achieve the electrical connection between the gate metal layer and the source/drain metal layer adjacent to each other;

the patterned second insulating layer formed on the source/drain metal layer and including the transition via-hole 8 and the second via-hole 11, so as to expose the first electrical connection pattern 102 and the second connection pattern 300; and the patterned first transparent conductive layer formed on the second insulating layer and including the slit common electrode 7, a fifth connection pattern 101 and a sixth connection pattern 301, the fifth connection pattern 101 being electrically connected to the first connection pattern 100 through the second via-hole 11 and the first electrical connection pattern 102 so as to electrically connect the gate metal layer and the first transparent conductive layer that are not adjacent to each other, the sixth connection pattern 301 being electrically connected to the second connection pattern 300 through the second via-hole 11 so as to electrically connect the source/drain metal layer and the first transparent conductive layer adjacent to each other. And the gate electrode 2, the gate insulating layer, the active layer pattern 5, the source electrode 3 and the drain electrode 4 constitute the TFT 1.

Third Embodiment

In this embodiment is provided a display device including the array substrate mentioned in the second embodiment. Because such defects as over-etching for the shallow via-hole and an abnormal angle of gradient when the nonadjacent conductive layers on the array substrate are electrically connected to each other through the via-holes have been overcome, it is able to improve the display quality of the display device.

Fourth Embodiment

In this embodiment is provided an electronic product including the display device mentioned in the third embodiment. Because such defects as over-etching for the shallow via-hole and an abnormal angle of gradient when the non-adjacent conductive layers on the array substrate are electrically connected to each other through the via-holes have been overcome, it is able to improve the display quality of the electronic product. The electronic product may be, but not limited to, any product or member having a display function, such as a liquid crystal panel, an electronic paper, a liquid crystal TV, a liquid crystal display (LCD), a digital photo frame, a mobile phone and a flat panel PC.

In the above embodiments, the serial numbers of the steps shall not be used to limit the order thereof and a person skilled in the art, without any creative effort, may change the order of the steps, which also fall within the scope of present disclosure.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

The invention claimed is:

1. An array substrate, comprising:
a first metal layer, a first insulating layer, a second metal layer, a second insulating layer and a first conductive layer sequentially formed on a base substrate,
wherein the first metal layer includes a first connection pattern, the first insulating layer includes a first via-hole, the second metal layer includes a second connection pattern, the second insulating layer includes a transition via-hole and a second via-hole, the first via-hole corresponds to a position where the first connection pattern is located, the transition via-hole corresponds to a position where the first via-hole is located, the first metal layer is electrically connected to the first conductive layer through the first via-hole and the transition via-hole, the second via-hole corresponds to a position where the second connection pattern is located, and the second metal layer is electrically connected to the first conductive layer through the second via-hole.

2. The array substrate according to claim 1, further comprising a second conductive layer on the first insulating layer, wherein the second conductive layer is formed at the first via-hole corresponding to the first connection pattern.

3. The array substrate according to claim 1, wherein a first electrical connection pattern is arranged between the first via-hole and the transition via-hole, and the first electrical connection pattern and the second metal layer are made of an identical material.

4. The array substrate according to claim 3, wherein the first metal layer is electrically connected to the first conductive layer through the first via-hole, the first electrical connection pattern and the transition via-hole.

5. The array substrate according to claim 2, wherein a pixel electrode is formed on the first insulating layer, and the pixel electrode is formed by the second conductive layer.

6. The array substrate according to claim 5, wherein the second conductive layer is a second transparent conductive layer with high transmittance, and a pattern of the first insulating layer and a pattern of the second transparent conductive layer are formed simultaneously by a single patterning process.

7. The array substrate according to claim 1, wherein the first conductive layer is made of Indium Tin Oxide (ITO) and/or Indium Zinc Oxide (IZO).

8. A display device at least comprising an array substrate, wherein the array substrate comprises:
a first metal layer, a first insulating layer, a second metal layer, a second insulating layer and a first conductive layer sequentially formed on a base substrate,
wherein the first metal layer includes a first connection pattern, the first insulating layer includes a first via-hole, the second metal layer includes a second connection pattern, the second insulating layer includes a transition via-hole and a second via-hole, the first via-hole corresponds to a position where the first connection pattern is located, the transition via-hole corresponds to a position where the first via-hole is located, the first metal layer is electrically connected to the first conductive layer through the first via-hole and the transition via-hole, the second via-hole corresponds to a position where the second connection pattern is located, and the second metal layer is electrically connected to the first conductive layer through the second via-hole.

9. The display device according to claim 8, wherein the array substrate further comprises a second conductive layer on the first insulating layer, and the second conductive layer is formed at the first via-hole corresponding to the first connection pattern.

10. The display device according to claim 8, wherein a first electrical connection pattern is arranged between the first via-hole and the transition via-hole, and the first electrical connection pattern and the second metal layer are made of an identical material.

11. The display device according to claim 10, wherein the first metal layer is electrically connected to the first conductive layer through the first via-hole, the first electrical connection pattern and the transition via-hole.

12. The display device according to claim 9, wherein a pixel electrode is formed on the first insulating layer, and the pixel electrode is formed by the second conductive layer.

13. The display device according to claim 12, wherein the second conductive layer is a second transparent conductive layer with high transmittance, and a pattern of the first insulating layer and a pattern of the second transparent conductive layer are formed simultaneously by a single patterning process.

14. The display device according to claim 8, wherein the first conductive layer is made of Indium Tin Oxide (ITO) and/or Indium Zinc Oxide (IZO).

15. A method for manufacturing an array substrate, comprising the steps of:
forming a first metal layer on a base substrate, and performing a patterning process on the first metal layer so as to form a pattern including a first connection pattern;
forming a first insulating layer on the first metal layer, and performing a patterning process on the first insulating layer so as to form one or more first via-holes corresponding to a position where the first connection pattern is located;
forming a second metal layer on the first insulating layer, and performing a patterning process on the second metal layer so as to form a pattern including a second connection pattern;
forming a second insulating layer on the second metal layer, and performing a patterning process on the second insulating layer so as to form one or more transition via-holes corresponding to positions where the first via-holes are located and one or more second via-holes corresponding to a position where the second connection pattern is located; and
forming a pattern including a first conductive layer on the second insulating layer.

16. The method according to claim 15, wherein the step of forming the first insulating layer on the first metal layer and performing a patterning process on the first insulating layer so as to form one or more first via-holes comprises:
applying a first photoresist onto the first insulating layer, and exposing and developing the first photoresist by using a half-tone or gray-tone mask, so as to form a first photoresist unreserved region corresponding to at least a region where the first via-holes are located; and
removing the first insulating layer corresponding to the first photoresist unreserved region by an etching process, so as to form the first via-holes.

17. The method according to claim 15, wherein the step of forming the first insulating layer on the first metal layer and performing the patterning process on the first insulating layer so as to form one or more first via-holes further comprises forming a pattern including a second conductive layer on the first insulating layer.

18. The method according to claim 17, wherein the step of forming a pattern including the second conductive layer on the first insulating layer comprises:

exposing and developing the first photoresist by using the half-tone or gray-tone mask so as to form a first photoresist partially-reserved region corresponding to at least a region where a pattern of the second conductive layer is located; and removing the photoresist at the first photoresist partially-reserved region by an ashing process, forming a second transparent conductive thin film on the photoresist and removing the remaining photoresist, so as to form the pattern including the second conductive layer.

19. The method according to claim 15, wherein the step of forming the second insulating layer on the second metal layer and performing the patterning process on the second insulating layer so as to form one or more transition via-holes and second via-holes comprises:

applying a second photoresist onto the second insulating layer, and exposing and developing the photoresist by using a half-tone or gray-tone mask so as to form a second photoresist unreserved region corresponding to at least the regions where the first via-holes are located; and removing the second insulating layer corresponding to the second photoresist unreserved region by an etching process, so as to form the transition via-holes and the second via-holes, wherein the transition via-holes correspond to positions where the first via-holes are located.

20. The method according to claim 15, wherein the first conductive layer is made of Indium Tin Oxide (ITO) and/or Indium Zinc Oxide (IZO).

* * * * *